United States Patent [19]

Wagenaar et al.

[11] 4,409,606

[45] Oct. 11, 1983

[54] HIGH BREAKDOWN VOLTAGE SEMICONDUCTOR DEVICE

[75] Inventors: Kornelis J. Wagenaar, Nijmegen; Hendrik C. De Graaff; Johannes A. Appels, both of Eindhoven, all of Netherlands

[73] Assignee: U.S. Philips Corporation, New York, N.Y.

[21] Appl. No.: 223,199

[22] Filed: Jan. 8, 1981

[30] Foreign Application Priority Data

Mar. 10, 1980 [NL] Netherlands ............... 8001409

[51] Int. Cl.³ .................................. H01L 29/90
[52] U.S. Cl. .................................. 357/13; 357/34; 357/52; 357/23
[58] Field of Search ............... 357/13, 34, 52, 53, 357/23 R, 23 HV

[56] References Cited

U.S. PATENT DOCUMENTS 4,329,703  5/1982  Priel et al. ..................... 357/34

Primary Examiner—James W. Davie
Attorney, Agent, or Firm—James J. Cannon, Jr.

[57] ABSTRACT

A semiconductor device having a semiconductor layer 3 of a first conductivity type which is situated on a substrate region 4 of the second opposite type. Present within an island-shaped region 3A of the layer 3 are a surface-adjoining active zone 8 of the second conductivity type, for example the base zone of a bipolar transistor or the channel region of a field effect transistor, and a juxtaposed highly doped contact zone of the first conductivity type. The thickness and the doping concentration of the layer 3 are so small that the layer is depleted up to the surface 2 at a reverse voltage across the p-n junction 5 of the layer 3 and the substrate region 4 which is lower than the breakdown voltage. According to the invention, a highly doped buried layer 8 is present between the layer 3 and the substrate region 4 and extends at least below at least a portion of the active zone 8, the shortest distance between the edge of the buried layer 11 and the edge of the contact zones 9 being at least equal to $$(2V_B/E_c)$$

where $V_B$ is the breakdown voltage of the p-n junction 5, and $E_c$ is the critical field strength above which avalanche multiplication occurs. As a result of this the effect of lateral current concentrations (Kirk effect) is avoided, while a high breakdown voltage is maintained.

12 Claims, 6 Drawing Figures

HIGH BREAKDOWN VOLTAGE SEMICONDUCTOR DEVICE

BACKGROUND OF THE INVENTION

1. Field of the Invention

The invention relates to a semiconductor device having a semiconductor body comprising a surface-adjoining semiconductor layer of a first conductivity type which is situated on a substrate region of the second opposite conductivity type and forms a p-n junction therewith, a separation region which extends from the surface over substantially the whole thickness of the semiconductor layer and surrounds an island-shaped region of the semiconductor layer, within which island-shaped region are present an active zone of the second conductivity type belonging to a semiconductor circuit element and a juxtaposed contact zone of the first conductivity type having a higher doping concentration than the semiconductor layer, the active zone and the contact zone both adjoining the surface and at least the contact zone being further entirely surrounded by the island-shaped region, the thickness and the doping concentration of the island-shaped region being so small that upon applying a voltage in the reverse direction across the p-n junction, the depletion zone extends up to the surface at a voltage which is lower than the breakdown voltage of the p-n junction.

It is to be noted that in the operating condition the same reverse voltage need not be present at any point across the p-n junction as a result of currents flowing parallel to the surface. As a result of the voltage drop caused by said currents it may occur that in the operating condition the island-shaped region is depleted in places where said reverse voltage is high and is not depleted entirely up to the surface in places where the reverse voltage across the p-n junction is comparatively low.

2. Description of the Prior Art

A semiconductor device of the kind described is disclosed in U.S. Pat. No. 4,292,642, assigned to the assignee of this application. A device is described in said patent wherein the island-shaped region constitutes the collector zone and the active zone of the second conductivity type constitutes the base zone of a vertical bipolar transistor. The emitter zone of the transistor is formed by a surface zone of the first conductivity type provided in said active zone.

As is explained in the above-mentioned patent, such a device has the important advantage that the breakdown voltage between the contact zone and, on the one hand the substrate region and on the other hand the active zone which in the operating condition often is at substantially the same potential as the substrate, may be very high and may even approach the unidimensionally calculated theoretical value. This results from the fact that at high collector-base voltage the island-shaped region is depleted up to the surface so that the field strength at the surface is considerably reduced.

Such a semiconductor device may be considered to be built up from a semiconductor circuit element with a juxtaposed junction field effect transistor therewith in series, the control electrode of which is formed by the substrate region.

A disadvantage of these devices is that the current which flows from the contact zone via the semiconductor layer (generally an expitaxial layer) to the active zone of the second conductivity type (or conversely, dependent on the conductivity types of the various regions), in the comparatively thin and high-ohmic part of the island-shaped region between the said active zone and the substrate region causes, at comparatively low values, a voltage drop which adversely influences the electrical properties of the device (the so-called "Kirk" effect, see IRE Transactions on Electron Devices, ED9, 1962 pp. 164–174). In the above-described bipolar transistor a considerable decrease of the gain ($h_{FE}$) occurs with very low currents. In such a transistor the reduction of the series resistance between contact zone and base zone by a buried layer which is usual in conventional bipolar transistors and which layer extends from below the base zone to below the contact zone, is not possible since as a result of this the depletion zone in practice would be restricted to the buried layer and could not extend up to the surface so that the high breakdown voltages in view could no longer be reached.

SUMMARY OF THE INVENTION

One of the objects of the invention is to provide a new structure of a semiconductor device as described above in which the said disadvantages are avoided while maintaining the desired high breakdown voltage.

The invention is based inter alia on the recognition that the end in view can be reached by using a highly doped zone of the first conductivity type which extends in a place between the substrate region and the island-shaped region suitably chosen with respect to the active zone and the contact zone.

According to the invention, a semiconductor device of the kind described in the opening paragraph is characterized in that between the semiconductor layer and the substrate region a buried layer of the first conductivity type is present having a higher doping concentration than the semiconductor layer and extending at least below at least a portion of said active zone and is separated from the active zone by the island-shaped region, in which, in projection, the distance in $\mu m$ between the edge of the buried layer and the edge of the contact zone is at least equal to $$2V_B/E_c$$

wherein $E_c$ is the critical field strength in volts per $\mu m$ above which avalanche multiplication occurs in the semiconductor layer, and $V_B$ is the breakdown voltage in volts of the p-n junction.

Since the buried layer does not extend below the contact zone (as is usual in conventional transistors) but in projection remains remote therefrom at a distance of at least $$2V_B/E_c \mu m$$

the depletion zone may extend between the buried layer and the contact zone from the p-n junction up to the surface as a result of which the breakdown voltage is substantially equally high as in the absence of the buried layer. However, in the region situated below the active zone the buried layer ensures that the current from the active zone to the buried layer crosses rectilinearly and causes substantially no voltage drop in the part of the island-shaped region situated between the active zone and the buried layer so that the above-described problems are avoided.

A first preferred embodiment is characterized in that, in projection, the buried layer does substantially not project beyond the active zone of the second conductivity type. In order to ensure that the current is distributed as regularly as possible over the cross-section of the semiconductor layer, according to a further preferred embodiment the buried layer at its edge at least on the side of the contact zone adjoins a wall of the first conductivity type extending from the edge of the buried layer up to the surface, which wall is more highly doped than the semiconductor layer.

The separation region which surrounds the island-shaped region laterally may be a region of insulating or very high-ohmic material and consists, for example, of silicon oxide or high-ohmic amorphous or polycrystalline semiconductor material. However, according to a preferred embodiment the separation region is a semiconductor region of the second conductivity type which forms a second p-n junction with the island-shaped region, the buried layer being separated from the separation region by the island-shaped region. In order to prevent the field strength at said second p-n junction from untimely reaching the critical value at the surface, it is preferably ensured that, taken along the surface, the shortest distance from the contact zone to the edge of the separation region is larger than the distance over which the depletion zone associated with the second p-n junction extends along the surface at the breakdown voltage of said second p-n junction.

Within the semiconductor body the active zone of the second conductivity type may be surrounded entirely by the island-shaped region and thus be kept at a potential chosen to be different from the substrate region.

According to a further preferred embodiment, at least one further active zone of the first conductivity type is provided within the active zone of the second conductivity type. This further active zone, for example, may form the emitter zone and the active zone of the second conductivity type may form the base zone of a bipolar transistor. When in that case the separation region is a semiconductor region of the second conductivity type, this may advantageously be connected to the base zone. As a result of this the base zone automatically has substantially the same potential as the substrate region so that a separate connection may be dispensed with.

However, instead thereof the active zone of the first conductivity type may belong to the source and drain zones of an insulated gate field effect transistor together with the island-shaped region of the first conductivity type, of which the active zone of the second conductivity type comprises the channel region. Said field effect transistor may be a so-called V-MOST in which at least one groove, whether or not in the form of a V, extends from the surface through the active zones of the first and the second conductivity types into the island-shaped region, the wall of the groove, at least at the area of the active zone of the second conductivity type, being covered with an insulating layer on which a gate electrode is provided. However, according to another preferred embodiment it is also possible to manufacture a so-called D-MOST in which an insulating layer is provided on the said surface at least at the area where the active zone of the second conductivity type adjoins said surface, on which insulating layer a gate electrode is provided between the active zone of the first conductivity type and the island-shaped region.

BRIEF DESCRIPTION OF THE DRAWINGS

The invention will now be described in greater detail with reference to a few embodiments and the drawings in which.

DESCRIPTION OF THE PREFERRED EMBODIMENTS

Figure 1:
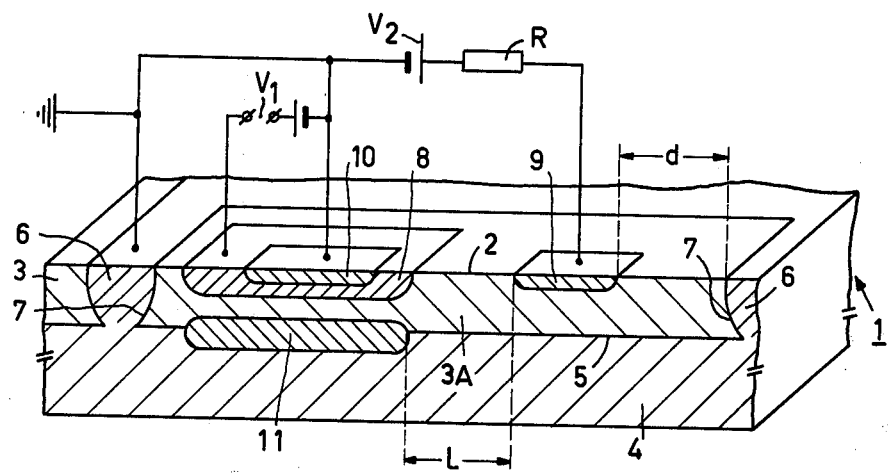
FIG. 1 shows, partly as a perspective view and partly as a diagrammatic cross-sectional view, a semiconductor device according to the invention.

The figures are diagrammatic and not drawn to scale, in which in particular the dimensions in the direction of thickness are exaggerated. Corresponding parts are generally referred to by the same reference numerals in the figures. Semiconductor regions of the same conductivity type are shaded in the same direction in the cross-sectional views. FIG. 1 shows a semiconductor device according to the invention partly as a perspective view and partly as a diagrammatic cross-sectional view. The device has a semi-conductor body 1 with a semiconductor layer 3 of the first conductivity type adjoining a surface 2. In this example an n-type silicon layer having a thickness of 15 $\mu$m and a doping concentration of $4 \times 10^{14}$ atoms per $cm^3$. The layer 3 is situated on a substrate region 4 of the second opposite conductivity type, in this case of p-type silicon having a doping concentration of $1.5 \times 10^{15}$ atoms per $cm^3$, and forms a p-n junction 5 therewith.

A separation region 6 extends from the surface 2 over the whole thickness of the semiconductor layer 3 and surrounds an island-shaped region 3A of the layer 3. In this example the separation region 6 is formed by a p-type silcon region which forms a second p-n junction 7 with the island-shaped region 3A.

An active zone 8 of the second conductivity type, so in this example p-conductivity type, having a thickness of approximately 3 $\mu$m and associated with a semiconductor surface element, in this example a bipolar vertical transistor, is present within the island-shaped region 3A. Moreover present in the region 3A beside the zone 8 is a contact zone 9 of the first, n-conductivity type and a higher doping concentration than that of the layer (3, 3A). Both zones 8 and 9 adjoin the surface 2. The contact zone 9, and in this example also the zone 8, are fully surrounded by the island-shaped region 3A within the semiconductor body.

The thickness and the doping concentration of the region 3A are so small that (with the given substrate doping) upon applying a voltage in the reverse direction across the p-n junction 5 the depletion zone extends up to the surface 2 at a voltage which is lower than the breakdown voltage of the p-n junction 5. In this example at a given point of the p-n junction 5 between the zones 8 and 9, the region 3A is depleted up to the surface 2 at a voltage of 90 volts across the p-n junction 5 at the area of said point, while the breakdown voltage of the p-n junction 5 is approximately 300 volts. Within the p-type active zone 8 an active zone 10 of the first, n-conductivity type is provided. Said zone 10 constitutes the emitter zone and the zone 8 constitutes the base zone of a bipolar transistor of which the island-shaped region 3A is the collector zone and zone 9 is the collector contact zone.

The bipolar transistor described so far has a high collector-base breakdown voltage. FIG. 1 shows a circuit possibility with load resistor R. A control voltage $V_1$ of, for example, a few volts, can be applied between the base zone 8 and the emitter region 10. The regions 8 and 6 and 4 respectively, upon applying a high collector-emitter voltage $V_2$, are substantially at the same potential relative to the region 3A. As a result of the complete depletion of the region 3A up to the surface 2 beside the contact 9, a very high collector-base breakdown voltage can be reached, as described in the above-mentioned U.S. Pat. No. 4,292,642.

A drawback, however, is that the gain factor ($h_{FE}$) without further measures is strongly reduced at low collector currents. This is due to the large current density in the comparatively thin and high-ohmic collector layer between the base zone 8 and the substrate region 4.

According to the invention, therefore, there is provided between the semiconductor layers 3 and 3A, respectively, and the substrate region 4, a buried layer 11 of the first n-conductivity type having a higher doping concentration than the layer 3 and extending at least below at least a portion of the zone 8, in this example under the entire areas of the zone 8. In this example the buried layer 11 is approximately 10 μm thick and is separated from the p-type active zone, in this case the base zone, 8 and from the separation region 6 by the island-shaped region 3A; the vertical distance between the buried layer 11 and the base zone 8 in this example is approximately 10 μm and the horizontal distance between the buried layer and the separation region 6 is approximately 10 μm. In projection (see FIG. 1) the distance L between the edge of the buried layer 11 and the edge of the contact zone 9 is in this example 40 μm. The critical field strength $E_c$ above which avalanche multiplication occurs in the silicon layer 3 is approximately 25 volts per μm and the breakdown voltage $V_B$ of the p-n junction 5 is approximately 300 volts. From this it follows that $$2V_B/E_c = 24 \ \mu m,$$

so that $L > 2V_B/E_c$. When it is assumed to an approximation that the field strength at the surface above the edge of the buried layer 11 is substantially equal to zero and in the direction of the contact zone 9 increases linearly to an approximation up to a maximum value at the edge of zone 9, then said maximum value at the breakdown voltage still is below the critical field strength, so that no breakdown at the surface occurs at the edge of zone 9.

It has furthermore been ensured that the shortest distance d (see FIG. 1) taken along the surface 2, from the contact zone 9 to the edge of the separation region 6 is larger than the maximum distance over which the depletion zone of the second p-n junction 7 can extend along the surface 2, that is to say the width of the depletion zone at the breakdown voltage of p-n junction 7. As a result of the above-mentioned conditions the base-collector breakdown voltage of the transistor is substantially equally high as in the absence of the buried layer 11.

As a result of the presence of the buried layer 11, however, the current in this device according to the invention flows substantially directly from the buried layer 11 to the base zone 8 in a direction transverse to the surface. As a result of this, only a negligible lateral voltage drop occurs below the base zone and the gain factor $h_{FE}$ remains high at comparatively large current strengths.

In the FIG. 1 embodiment the active base zone 8 is surrounded within the semiconductor body entirely by the island-shaped region 3A. As a result of this the base zone, as also shown in FIG. 1, can be set up at a potential differing from that of the substrate region 4. In some cases, however, the FIG. 2 embodiment will be preferred in which the active zone 8 is connected to the separation region 6 of the same conductivity type. For simplicity, the transistor structure shown in FIG. 1 is considered to be rotationally symmetrical about the line M—M' but this need by no means be the case.

Figure 2:
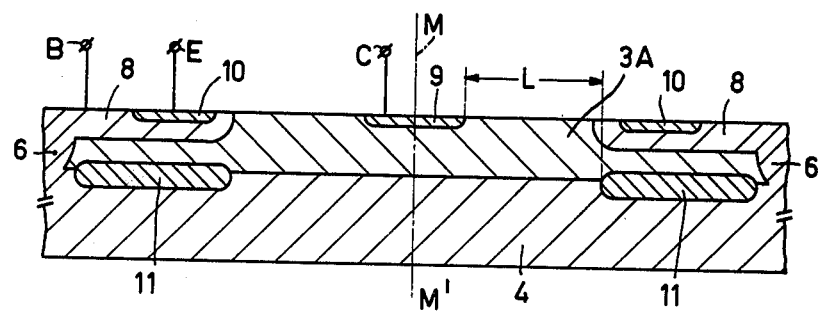
FIGS. 2, 3 and 4 are diagrammatic cross-sectional views of modified embodiments of the construction shown in FIG. 1.

In the structure shown in FIG. 2 the base zone 8 is substantially at the same potential as the substrate region 4 which is connected thereto by the separation region 6. As a result of this, one connection terminal B for base and substrate will suffice. The emitter and the collector are connected at E and C.

In the embodiment shown in FIGS. 1 and 2 the buried layer 11 in projection does substantially not extend beyond the active zone 8. However, this need by no means be the case. See, for example, the FIG. 3 embodiment in which the buried layer 11 in the direction of the contact zone 9 extends beyond the active base zone 8. However, the above-mentioned condition $L \geq 2V_B/E_c$ should always be satisfied. For illustration, a sunken silicon oxide region which surrounds the island-shaped region 3A was chosen in this example as a separation region 6. This region 3A is covered with an oxide layer 31 in which windows for the emitter, base and collector contacts 31, 33 and 34 are provided. Such a passivating oxide layer is generally also present on the surface of the embodiments shown in FIGS. 1 and 2 but is not shown to avoid complexity of the Figures.

Figure 4:
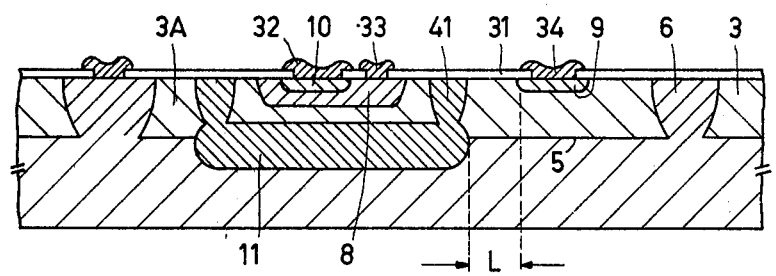

FIG. 4 shows another embodiment which in outline corresponds to that of FIG. 1 with the difference that the buried layer 11 at its edge at least on the side of the contact zone 9, and in this example along its entire edge, adjoins a highly doped n-type wall 41 extending from said edge to the surface. The wall 41 is more highly doped than the layer 3. This wall need not be contacted at the surface and serves to ensure that the current from the collector contact zone 9 to the base zone 8 is distributed homogeneously over the cross-section of the epitaxial layer 3 already between the zone 9 and the wall 41, after which the current crosses straight from the buried layer 11 to the base zone 9. As a result of this, current concentration with associated voltage drop is avoided optimally.

Figure 5:
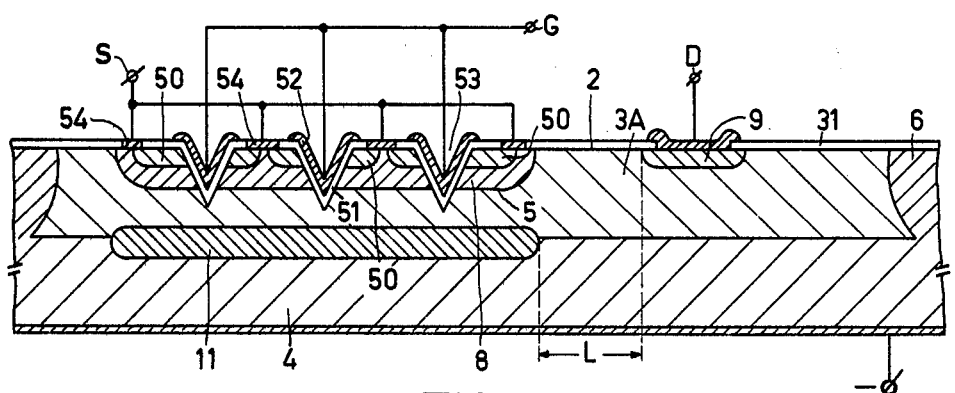
FIG. 5 is a diagrammatic cross-sectional view of another semiconductor device in accordance with the invention.
Figure 6:
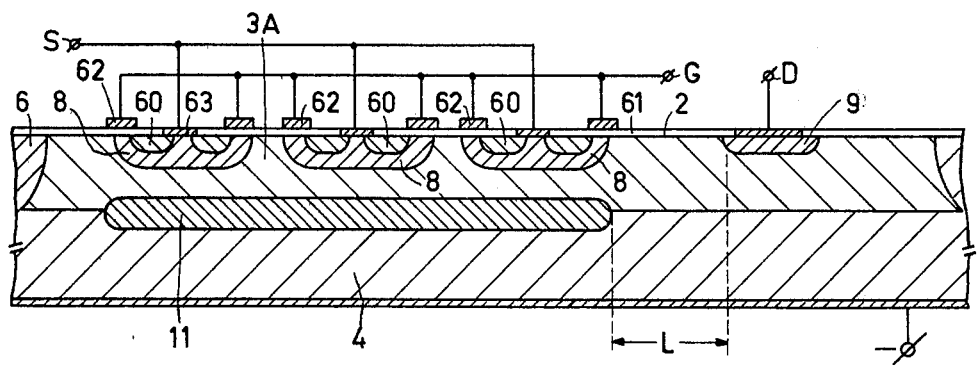
FIG. 6 is a diagrammatic cross-sectional view of a further embodiment of the device.

FIGS. 5 and 6 are quite different embodiments of the device according to the invention. FIG. 5 is a diagrammatic cross-sectional view of a field effect transistor of the so-called V-MOS type having an active zone 8 of the p-conductivity type comprising the channel region of the field effect transistor and active zones 50 of the n-conductivity type which are situated therein and which constitute the source zones of the transistor, while the n-type island-shaped region 3A constitutes the drain source together with the n-type buried layer 11 and the n-type contact zone 9. The roles of source and drain zones may also be reversed. Grooves 53 extend from the surface 2 through the active zones 50 and 8 into the island-shaped region 3A. The wall of the grooves 53, at least at the area of the active zone 8, is covered with an insulating layer 51 on which interconnected electrodes 52 are provided. In this case also the above-mentioned conditions for thickness and doping of the region 3A and the distance L are satisfied so that a very high breakdown voltage is reached for the p-n junction 5 between the drain zone and the channel region. Simultaneously, due to the presence of the highly doped n-type buried layer 11 as a result of which the current crosses straight from said buried layer to the zone 8, current concentration and voltage drop in the region between the zone 8 and the buried layer 11 is avoided.

The FIG. 5 embodiment can be realized by using the same conductivity types and dimensions for the various semiconductor regions as in the preceding example. At a doping concentration of $4 \times 10^{14}$ atoms per cm$^3$ for the epitaxial layer 3 and a doping concentration of $7 \times 10^{14}$ atoms per cm$^3$ for the substrate region 4, the breakdown voltage between drain zone and channel region with these dimensions becomes approximately 400 volts, in which, as shown in FIG. 5, the source zones 50 are interconnected and are short-circuited with the channel region 8 via electrodes 54. The source zones 50 are connected to a source connection S, the gate electrodes 52 are connected to a control electrode connection G and the drain zone is connected to a drain connection D via the contact zone 9.

FIG. 6 finally is a diagrammatic cross-sectional view of still another embodiment of the device in accordance with the invention. The device shown in FIG. 6 is a modified embodiment of the FIG. 5 embodiment, namely a so-called D-MOS transistor, a different type of insulated gate field effect transistor. An insulating layer 61 of, for example, silicon oxide or silicon nitride is provided on the upper surface 2 of the semiconductor plate. Said layer is present at least at the area of the p-type active zone 8 which in this example is divided into three parts which, if desired, may be connected together beyond the plane of the drawing. Within each zone 8 an n-type source zone 60 is present. Gate electrodes 62 are provided on the insulating layer 61 between the zones 60 and the n-type conductive island-shaped region 3A which in this case also belongs to the drain zone. The source zones 60 are connected to the zones 8 comprising the channel region by electrodes 63 on the surface 2 in the same manner as in FIG. 5. With the same dimensions and doping concentrations as in FIG. 5, breakdown voltages of the order of 400 volts can be reached in this case also.

Figure 3:
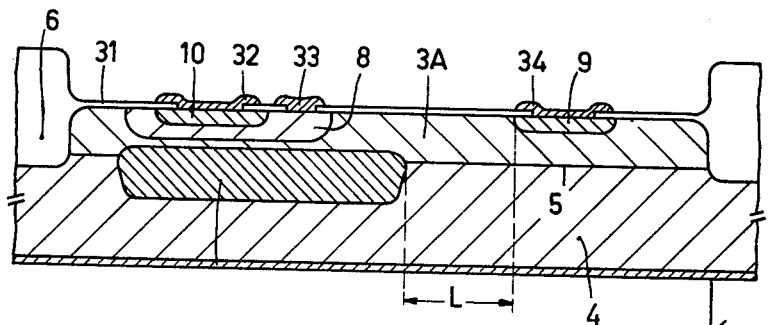

In FIGS. 3, 5 and 6 the substrate 4, as usual, is preferably connected to the most negative voltage of the circuit.

The invention is not restricted to the embodiments described. Many variations are possible to those skilled in the art without departing from the scope of this invention. For example, in the devices shown in FIGS. 1, 2, 4, 5 and 6, separation regions of an insulating material as used in FIG. 3 may be used intead of semiconductor separation regions 6. In the FIG. 3 embodiment the buried layer 11 may extend to the left without objections, if desired, up to the sunken oxide pattern 6. Although in the examples of FIGS. 1, 2, 5 and 6 the buried layer 11 extends substantially only below the active zone 8, the buried layer in these cases also may extend further in the direction of the contact zone 9 in analogy with FIG. 3, provided the condition $$L \geq 2V_B/E_c$$

is satisfied. Except in FIG. 4, vertical walls 41 (see FIG. 4) may be provided between the buried layer and the surface in all the other embodiments, which walls, if desired, need be present only between the zones 8 and 9 to reach the desired effect. In each example the conductivity types chosen may each be replaced by their opposite types. Instead of silicon, other semiconductor materials may also be used, while for the insulating layers 31, 51 and 61 other layers, for example, silicon nitride, silicon oxynitride or aluminum oxide and the like may be used instead of silicon oxide, or a combination of various insulating layers may be used situated one on top of the other. Besides in bipolar transistors and insulated gate field effect transistors the invention may also be applied advantageously to other semiconductor devices. The semiconductor device in accordance with the invention can advantageously form part of an integrated circuit in which, in addition to the region 3A, other island-shaped regions of the semiconductor layer also occur which comprise other semiconductor elements.

What is claimed is:

1. A semiconductor device having a semiconductor body comprising a surface-adjoining semiconductor layer of a first conductivity type which is situated on a substrate region of the second opposite conductivity type and forms a p-n junction therewith, a separation region which extends from the surface over substantially the whole thickness of the semiconductor layer and surrounds an island-shaped region of the semiconductor layer, within which island-shaped region are present an active zone of the second conductivity type belonging to a semiconductor circuit element and a juxtaposed contact zone of the first conductivity type having a higher doping concentration than the semiconductor layer, the active zone and the contact zone both adjoining the surface and at least the contact zone being further surrounded entirely by the island-shaped region, the thickness and the doping concentration of the island-shaped region being so small that upon applying a voltage in the reverse direction across the p-n junction, the depletion zone extends up to the surface at a voltage which is lower than the breakdown voltage of the p-n junction, characterized in that between the semiconductor layer and the substrate region a buried layer of the first conductivity type is present having a higher doping concentration than the semiconductor layer and extending at least below at least a portion of the said active zone and is separated from the active zone by the island-shaped region, in which, in projection, the distance in μm between the edge of the buried layer and the edge of the contact zone is at least equal to $$2V_B/E_c$$

wherein $E_c$ is the critical field strength in volts per μm above which avalanche multiplication occurs in the semi-conductor layer, and $V_B$ is the breakdown voltage in volts of the p-n junction.

2. A semiconductor device as claimed in claim 1, characterized in that, in projection, the buried layer does not project beyond the active zone of the second conductivity type.

3. A semiconductor device as claimed in claim 1, characterized in that at its edge at least on the side of the contact zone the buried layer adjoins a wall of the first conductivity type extending from the edge of the buried layer up to the surface, which wall is more highly doped than the semiconductor layer.

4. A semiconductor device as claimed in any one of the preceding claims, characterized in that the separation region is a semiconductor region of the second conductivity type which forms a second p-n junction with the island-shaped region, the buried layer being separated from the separation region by the island-shaped region.

5. A semiconductor device as claimed in claim 4, characterized in that, taken along the surface, the shortest distance from the contact zone to the edge of the separation region is larger than the distance over which the depletion zone associated with the second p-n junction extends along the surface at the breakdown voltage of said junction.

6. A semiconductor device as claimed in any one of claims 1 to 3, characterized in that the active zone of the second conductivity type within the semiconductor body is surrounded entirely by the island-shaped region.

7. A semiconductor device as claimed in any one of claims 1 to 3, characterized in that within the active zone of the second conductivity type at least an active zone of the first conductivity type is provided.

8. A semiconductor device as claimed in claim 7, characterized in that the active zone of the first conductivity type and the island-shaped region belong to the souce and drain zones of an insulated gate field effect transistor whose active zone of the second conductivity type comprises the channel region.

9. A semiconductor device as claimed in claim 8, characterized in that at least a groove extends from the surface through the active zones of the first and the second conductivity types into the island-shaped region, the wall of the groove, at least at the area of the active zone of the second conductivity type, being covered with an insulating layer on which a gate electrode is provided.

10. A semiconductor device as claimed in claim 8, characterized in that on the said surface at least at the area where the active zone of the second conductivity type adjoins said surface an insulating layer is provided on which a gate electrode is provided between the active zone of the first conductivity type and the island-shaped region.

11. A semiconductor device as claimed in claim 7, characterized in that the active zone of the first conductivity type constitutes the emitter zone and the active zone of the second conductivity type constitutes the base zone of a bipolar transistor.

12. A semiconductor device as claimed in claim 11, in which the separation region is a semiconductor region of the second conductivity type and in which the base zone is connected to the separation region.

* * * * *